(12) United States Patent  
Van Den Nieuwelaar et al.

(10) Patent No.: US 9,606,457 B2  
(45) Date of Patent: Mar. 28, 2017

(54) LITHOGRAPHIC APPARATUS AND DEVICE MANUFACTURING METHOD

(71) Applicant: ASML Netherlands B.V., Veldhoven (NL)

(72) Inventors: Norbertus Josephus Martinus Van Den Nieuwelaar, Tilburg (NL); Petrus Franciscus Van Gils, Rijen (NL); Arthur Erland Swaving, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 516 days.

(21) Appl. No.: 13/748,889

(22) Filed: Jan. 24, 2013

(65) Prior Publication Data

US 2013/0215408 A1    Aug. 22, 2013

Related U.S. Application Data

(60) Provisional application No. 61/601,579, filed on Feb. 22, 2012.

(51) Int. Cl.  
*G03B 27/42* (2006.01)  
*G03B 27/58* (2006.01)  
(Continued)

(52) U.S. Cl.  
CPC ............. *G03F 7/7075* (2013.01); *G03F 7/00* (2013.01); *G03F 7/70533* (2013.01);  
(Continued)

(58) Field of Classification Search  
CPC ............. G03F 7/70716; G03F 7/70725; G03F 7/70733; G03F 7/7075; G03F 7/70758;  
(Continued)

(56) References Cited

U.S. PATENT DOCUMENTS 6,851,872 B1 * 2/2005 Okubo .............. H01L 21/67276  
118/52  
7,099,733 B2    8/2006 Hidemitsu et al.  
(Continued)

FOREIGN PATENT DOCUMENTS

JP    08-316130 A    11/1996  
JP    2001/004321 A    1/2001  
(Continued)

OTHER PUBLICATIONS

English-Language Abstract for Japanese Patent Publication No. 2006-294860 A, published Oct. 26, 2006; 1 page.  
(Continued)

*Primary Examiner* — Christina Riddle  
(74) *Attorney, Agent, or Firm* — Sterne, Kessler, Goldstein & Fox P.L.L.C.

(57) ABSTRACT

A substrate handler for transferring substrates to be exposed from a track to a lithographic apparatus. The substrate handler comprises a controller. The controller is configured to determine an instance for starting a transfer process of a first one of the substrates. The instance is based on a predetermined processing characteristic of the lithographic apparatus, in order to maintain a transfer period of the substrate in the substrate handler substantially constant.

14 Claims, 3 Drawing Sheets

(51) Int. Cl.
*G03B 27/32* (2006.01)
*G03F 7/20* (2006.01)
*G03F 7/00* (2006.01)

(52) U.S. Cl.
CPC ...... *G03F 7/70725* (2013.01); *G03F 7/70733* (2013.01); *G03F 7/70991* (2013.01)

(58) Field of Classification Search
CPC ............ G03F 7/70775; G03F 7/70808; G03F 7/70908; G03F 7/70916; G03F 7/70991; G03F 7/705; G03F 7/70533; Y10S 901/02; Y10S 901/06; Y10S 901/07; Y10S 901/08; Y10S 901/09; B25J 9/1664; B25J 11/095; B25J 11/0095; H01L 21/67703; H01L 21/67739; H01L 21/67745; H01L 21/67748; H01L 21/68; H01L 21/68707; H01L 21/68714; H01L 21/67276; H01L 21/67736
USPC .... 355/53, 72–77; 250/492.1, 492.2, 492.22, 250/493.1, 548; 901/2, 6–8; 414/222.02, 414/222.03; 700/245, 250, 254, 228
See application file for complete search history.

(56) References Cited

U.S. PATENT DOCUMENTS

| | | | |
|---|---|---|---|
| 2001/0053291 A1* | 12/2001 | Fujita | 396/564 |
| 2002/0076306 A1* | 6/2002 | Tateyama et al. | 414/225.01 |
| 2002/0136629 A1* | 9/2002 | Sasaki | H01L 21/67259 414/222.13 |
| 2002/0197746 A1* | 12/2002 | Matsunaga | H01L 21/67748 438/5 |
| 2004/0078109 A1* | 4/2004 | Babikian | G05B 19/41865 700/121 |
| 2004/0229441 A1* | 11/2004 | Sugimoto et al. | 438/400 |
| 2004/0249494 A1* | 12/2004 | Kobayashi et al. | 700/112 |
| 2005/0137734 A1* | 6/2005 | Nieuwelaar et al. | 700/100 |
| 2005/0278049 A1 | 12/2005 | Van Den Nieuwelaar et al. | |
| 2005/0287821 A1 | 12/2005 | Higashi et al. | |
| 2006/0223334 A1* | 10/2006 | Saki | 438/765 |
| 2007/0166030 A1* | 7/2007 | Lee | 396/611 |
| 2008/0079925 A1 | 4/2008 | Hirano | |
| 2008/0117390 A1* | 5/2008 | Kaneko et al. | 355/27 |
| 2008/0212062 A1* | 9/2008 | Taguchi | G03F 7/70533 355/75 |
| 2009/0041926 A1* | 2/2009 | Miyata et al. | 427/8 |

FOREIGN PATENT DOCUMENTS

| | | |
|---|---|---|
| JP | 2002-075853 A | 3/2002 |
| JP | 2005/033013 | 2/2005 |
| JP | 2006-294860 A | 10/2006 |
| JP | 2008-091508 A | 4/2008 |
| KR | 10-2007-0037901 A | 4/2007 |

OTHER PUBLICATIONS

English-Language Abstract for Japanese Patent Publication No. 08-316130 A, published Nov. 29, 1996; 1 page.
English-Language Abstract and Detailed Description for Korean Patent Publication No. 10-2007-0037901 A, published Apr. 9, 2007; 4 pages.
English Language Abstract for Japanese Patent Publication No. JP 2001/004321, published Jan. 12, 2001; 2 pages.
Japanese Search Report by Registered Searching Organization directed to related Japanese Patent Publication No. JP 2013/172149, published Dec. 25, 2013; 8 pages.

* cited by examiner

LITHOGRAPHIC APPARATUS AND DEVICE MANUFACTURING METHOD

BACKGROUND

Field of the Present Invention

The present invention relates to a substrate handler, a lithographic apparatus and a method for processing a substrate by a substrate handler.

Description of Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate. In general, the integrated circuit (IC) will comprise a plurality of layers that are provided by sequentially forming different patterns on the substrate. In order to assure proper operation of the IC, it is of utmost importance that the layers that are applied are properly aligned with each other. In this respect, the term overlay is often used to characterize such an alignment. One of the factors that affects the overlay characteristics is the thermal condition of a substrate. In order to obtain a desired overlay characteristic, the sequence of layers forming the IC should be applied to the substrate which the substrate in substantially the same thermal state, which can e.g., be characterized by an absolute temperature of the substrate or a temperature uniformity or a combination thereof.

In order to apply the sequence of layers to the substrate (to form the IC) different processes are performed on the substrate including applying a resist layer, exposing the resist layer, etc.

These processes in general take place in different processing tools such as a lithographic apparatus or a track (e.g., performing a post-exposure bake process and applying a resist layer). As an interface between such tools, a substrate handler or handling tool is in general applied, such tool being provided with one or more ports for transporting substrates to and from the different tools. Often, such a substrate handler is also applied as a buffer for temporarily storing substrates in case the substrates cannot be handled instantaneously by the resp. tools.

Using such a buffering, or in general, handling the substrates by a substrate handler, has been found to affect the thermal condition of substrates when they are received by a lithographic tool for exposure.

As a result, sequentially applied layers of an IC can be provided on a substrate at different thermal conditions (with respect to overall temperature and/or temperature uniformity), thus possibly adversely affecting the overlay characteristics.

SUMMARY

It is desirable to improve a processing of substrates by a substrate handler to improve a thermal conditioning of substrates provided to a lithographic apparatus for exposure purposes.

According to an embodiment of the present invention, there is provided a substrate handler for transferring substrates to be exposed to a lithographic apparatus. The substrate handler is arranged to determine an instance for starting a transfer process of a substrate, where the instance is based on a predetermined processing characteristic of the lithographic apparatus.

According to another embodiment of the present invention, there is provided a lithographic system comprising a lithographic apparatus arranged to transfer a pattern from a patterning device onto a substrate. The apparatus comprises a port for connecting the lithographic apparatus to a substrate handler for receiving substrates to be exposes. The system further comprises a substrate handler according to the present invention, connectable to the port.

According to yet another embodiment of the present invention, there is provided a device manufacturing method comprising transferring a pattern from a patterning device onto a substrate. The method includes transferring the substrate to a lithographic apparatus by a substrate handler, where a transfer process of the substrate handler is started at an instance that is based on a predetermined processing characteristic of the lithographic apparatus in order to maintain a transfer period of the substrate in the substrate handler substantially constant.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
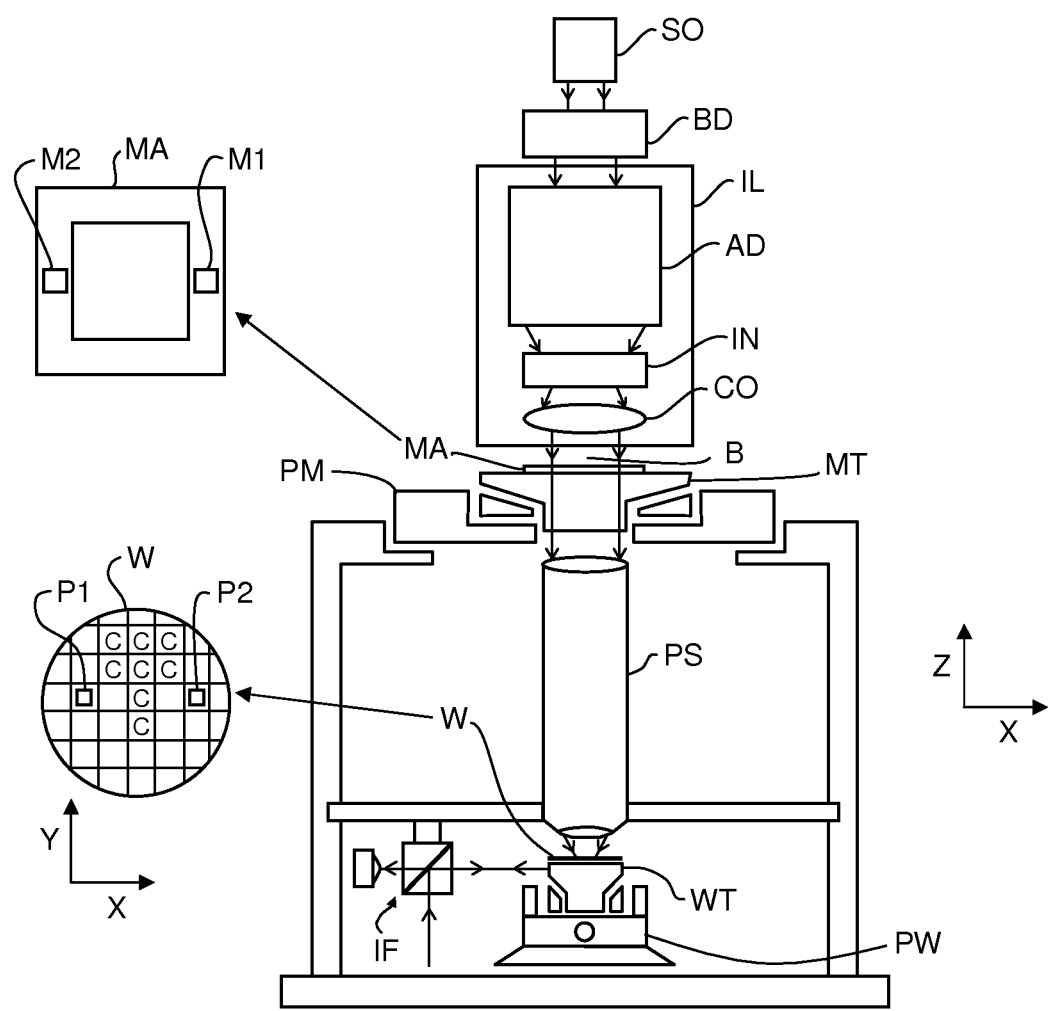
FIG. 1 depicts a lithographic apparatus according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus according to one embodiment of the present invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In order to provide the substrates to be exposed to the lithographic apparatus and remove exposed substrates from the apparatus, a substrate handler according to the present invention can be applied.

Such substrate handler is arranged to perform a transfer process for a substrate, whereby the transfer process of a substrate to be exposed, as performed by the substrate handler, is initiated at an instance that is based on a predetermined process characteristic of the lithographic apparatus.

Typically, a substrate handler, which is e.g., positioned between a processing tool such as a track and a lithographic apparatus, comprises one or more ports that are connectable to the processing tool or the lithographic apparatus. Such a substrate handler further comprises one or more robots for loading and unloading substrates.

Figure 2:
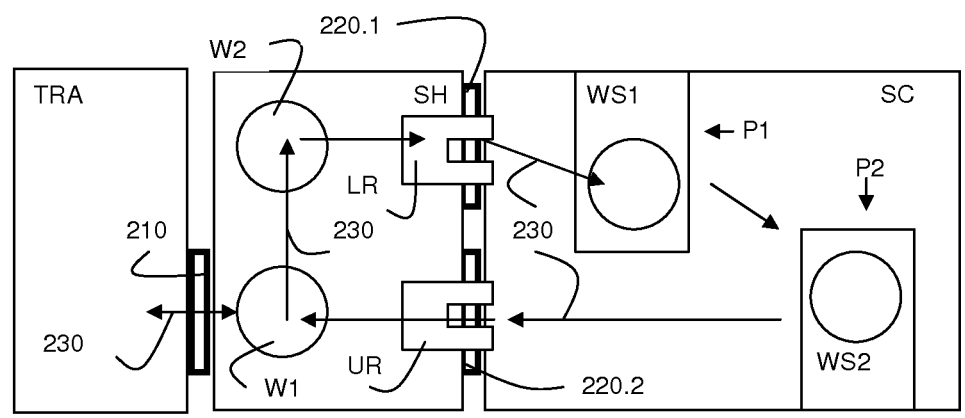
FIG. 2 depicts a top view of a substrate handler according to an embodiment of the present invention and part of processing equipment.

In FIG. 2, a top view of a substrate handler SH according to an embodiment of the present invention is schematically shown, arranged between a track (TRA) and a lithographic apparatus (indicated by the stage compartment SC, comprising a first wafer stage WS1 and a second wafer stage WS2 for holding substrates to be processed, such wafer stage e.g., including a substrate table such as substrate table WT as shown in FIG. 1)). The substrate handler as shown comprises a first port 210 which is e.g., connectable to a track (TRA) or other processing apparatus (not shown) and a second port that is connectable to a lithographic apparatus. In the arrangement as shown, the second port comprises an inlet port 220.1 for receiving substrates that have been processed by the lithographic apparatus and an outlet port 220.2 for providing substrates to lithographic apparatus for processing.

In general, such processing of a substrate involves both a measurement process, that may include an alignment process of the substrate and a height map determination, and an exposure process whereby a plurality of dies are exposed with a patterned radiation beam. Note that the first port 210 may also include an inlet port and an outlet port for transferring substrates to and from the track TRA.

As further indicated, the substrate handler SH comprises two robots (LR, UR) for transferring the substrates; a load robot LR for providing substrates to be processed, via the outlet port 220.2 to the lithographic apparatus and an unload robot UR for unloading substrates that have been exposed.

In general, the substrate handler SR may have one or more locations/positions where a substrate can be positioned temporarily, such waiting positions e.g., being indicated in FIG. 2 by W1 and W2. Such positions may also act a as buffer to temporarily hold a substrate while waiting for either the processing tool or the lithographic apparatus to accept the substrate. Alternatively, or in addition, the substrate handler may have a further buffering area (not shown) for storing processed substrates or substrates to be processed. A typical process of handling a substrate is indicated by the arrows 230 and can e.g., include transferring a substrate from the track TRA to a first waiting position W1, transferring the substrate to the second waiting position W2, loading the substrate into the stage compartment SC of the lithographic apparatus (e.g., using the load robot LR). Subsequently, the substrate can be processed on wafer stage WS1 (in position P1) where a measuring process can take place, an exposure process can be performed on position P2 (note that in order to expose the substrate, the wafer stages WS1 and WS2 will be swapped), and the processed substrate can outputted to the substrate handler SH, e.g., using unload robot UR.

In general, the time spend inside the substrate handler by a substrate may vary substantially, depending on the particular operation of e.g., the lithographic apparatus. Such a transfer process or more specifically, the processing time of a substrate may e.g., depend on the time it takes to perform any desired measurements prior to exposure and/or the time it takes to perform the desired exposures. Such a processing of a substrate by a lithographic apparatus typically depend on a large set of parameter that e.g., involve machine settings including scan speed, acceleration levels, or lot specific parameters such as mark or die locations, number of images, etc. Further, the processing time of a substrate may be influenced by the applied resist and required illumination during exposure, any adjustments to machine settings that are required to perform a particular exposure process, etc.

Typically, substrate handlers are not constructed to maintain an accurate temperature condition of a substrate, while the substrate is transferred (i.e., displaced) by a load or unload robot such as robots LR and UR. As such, when varying processing times occurring in a lithographic apparatus, the transition period for a substrate in a substrate handler may vary as well.

As a result, the temperature or temperature profile of a substrate arriving at the lithographic apparatus may depend on the lithographic process that is performed. As such, the temperature or temperature profile of a substrate during the exposure of an n-th layer on the substrate may be different from the temperature or temperature profile during the exposure of an (n−1)-th layer. As will be understood by the skilled person, such a difference in temperature during the exposure may affect the overlay characteristics between the n-th and (n−1)-th layer.

In order to avoid such adverse effects on the overlay characteristic, one should ensure that the processing time of a substrate by the substrate handler, in particular an ill conditioned processing, is kept substantially constant, thereby obtaining that an exposure of an n-th layer on a substrate can be performed in substantially the same (thermal) circumstances as the exposure of the (n−1)-th layer.

In order to realize this, the substrate handler according to the present invention is arranged to determine an instance for starting a transfer process of a substrate based on a predetermined processing characteristic of the lithographic apparatus, in order to maintain a transfer period of the substrate in the substrate handler substantially constant.

In general, a plurality of substrates is exposed sequentially using the same patterning device or reticle or mask. In general, the processing of each substrate in such a lot of substrates shall require substantially the same amount of time, although a deviating processing time may be noticed for the first substrate of a lot, due to the performance of specific lot-dependent measurements that are performed at the start of a new lot of substrates. Other operations such as an exchange of a patterning device or reticle or mask may result in a deviating processing time for the first substrate of a lot. In order to maintain a transfer period of a substrate substantially constant, various options exist.

In a first embodiment, the instance at which the transfer process is initiated is based on a predetermined processing characteristic of the lithographic apparatus, whereby the predetermined processing characteristic comprises a measured processing time of at least one earlier processed substrate. In such embodiment, a processing time of a substrate by a lithographic apparatus is, in a first stage, observed and e.g., stored in a memory unit of a control unit of the substrate handler or the lithographic apparatus. Such a processing time can e.g., span the period of time that expires between the loading of the substrate into the stage compartment and the instance at which the exposed substrate is available (e.g., at the unload robot UR). When such processing time has been determined for at least one substrate, the processing of subsequent substrates by the substrate handler can be synchronized with this processing time. Based on the previously determined processing time, one can determine when a next substrate needs to be made available to the lithographic apparatus such that no delays occur in the processing by the lithographic apparatus and, assuming that the time to process a substrate by the substrate handler is also known, one can determine at which instance to start a transfer process of a next substrate such that, when the substrate is ready to be loaded into the lithographic apparatus, the apparatus is indeed available to receive the substrate, such that no unwanted delays occur inside the substrate handler.

In order to determine a processing time of a substrate in a lithographic apparatus, for a particular process or for a particular substrate in a lot, the substrate handler may e.g., for a limited number of substrates (e.g., between 2 and 10) be operated in a learning mode. During such a learning mode, the following actions may be performed: The operating pace of the substrate handler is slowed down (compared to an optimal pace with respect to productivity) to minimize the waiting time of the substrates at the load and/or unload robots LR and UR. Note that this may have an adverse effect on the productivity (for the limited number of substrates). The operation of the lithographic apparatus is synchronized with this reduced pace of the substrate handler. The processing times of the limited number of substrates is monitored and stored, e.g., in a memory unit that is accessible by a control unit controlling an operation of the substrate handler.

Figure 3:
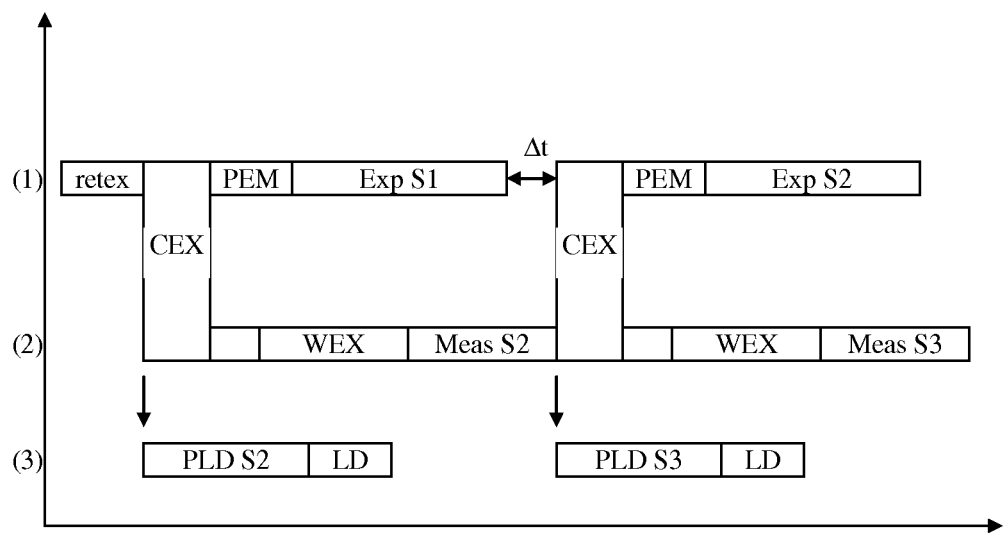
FIG. 3 depicts a process scheme of a substrate handler according to an embodiment of the present invention during a learning mode.

In FIG. 3, an operation of a substrate handler and a corresponding operation of a lithographic apparatus are schematically shown. FIG. 3 schematically shows, as a function of time t, various processes occurring in both a substrate handler and a lithographic apparatus during a learning mode as described. With respect to the processes occurring in the lithographic apparatus, the schedule of FIG. 3 assumes a so-called dual stage (or chuck) apparatus whereby an exposure of a first substrate can be performed on a first chuck or stage, while a measuring process can be performed on a second substrate. Note however, that similar timing schemes may also be devised for other types of lithographic apparatus, for example an apparatus having one substrate stage and one measurement stage, wherein the substrate stage holds a substrate, and the measurement stage is for performing measurements and does not hold a substrate.

In the timing schedule of FIG. 3, processes (1), (2) and (3) are schematically shown.

Process (1) starts with a processing step RETEX, referring to an exchange of a patterning device or reticle in the lithographic apparatus. Note that such a RETEX operation may further include additional measurements or operations such as the alignment of the reticle or patterning device. As a next processing step (which is common to processes (1) and (2)), a chuck or stage exchange (CEX) is schematically shown whereby both chucks or stages swap positions (e.g., positions P1 and P2 as shown in FIG. 2). In the schedule as shown, the first chuck exchange CEX provides in a swap between a chuck holding a first substrate (that has been measured) to the expose position for exposure. Prior to the exposure process on the first substrate (indicated by "Exp 1"), pre-exposure measurement or processes may need to be performed (e.g., including an alignment of the substrate with the patterning device), such measurements or processes being indicated in FIG. 3 as PEM.

As further can be seen, at a fixed instance (indicated by the arrows) relative to the chuck exchange CEX, a transfer process of a substrate handler (indicated as process (3)) is shown, the process comprising a pre-load stage PLD and a load stage LD. During the preload stage PLD, a substrate that is e.g., received from a track or other processing apparatus (the substrate being indicated by the index S1, S2 or S3) is transported and processed inside the substrate handler toward the load robot, e.g., robot LR of FIG. 2. During the load stage LD, a previously exposed substrate is received by the substrate handler, and a substrate to be processed (substrate S2) is provided to the lithographic apparatus. In the lithographic apparatus, this processing step is thus indicated by WEX, referring to a wafer or substrate exchange. Once the wafer or substrate exchange process (WEX) is concluded, the received substrate (substrate S2) can undergo a measurement process, indicated by "Meas S2". Once the measuring process on substrate S2 is completed, a next chuck exchange (CEX) can be performed.

Note that, during the learning mode as shown, the transfer processes of consecutive substrates by the substrate handlers are initiated at a comparatively low pace. This results in a comparatively long period indicated as WEX, during which substrates have to wait in the lithographic apparatus before being exchanged (due to the late triggering of the transfer process (indicated by the arrows). Such an approach enables to handle any delays inside the lithographic apparatus instead of having variable processing times in the substrate handler. Note that, as indicated by idle time $\Delta t$, this delay in substrate exchange may adversely affect the productivity. By performing the indicated process for a number of substrates, the processing time of a substrate in the lithographic apparatus, can be determined, e.g., by monitoring the time passed between the receipt of a substrate to be processed (e.g., receipt of substrate S2) and the end of the exposure process of substrate S2. Based on this processing time, an instance can be determined at which time the transfer process (e.g., including the pre-load PLD and load stages LD as indicated) should be initiated.

Figure 4:
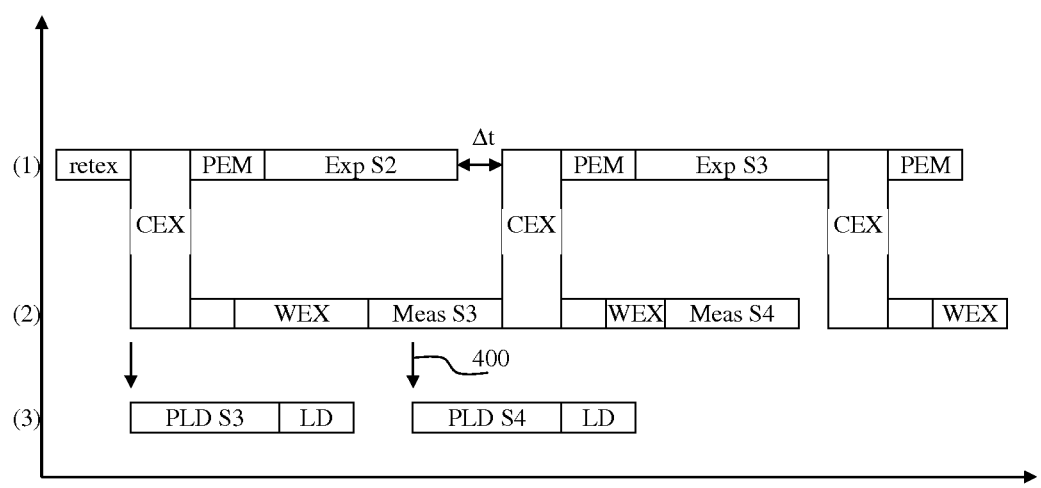
FIG. 4 depicts a process scheme of a substrate handler according to an embodiment of the present invention whereby an optimized starting instance of the transfer process is applied.

The effect of this is schematically shown in FIG. 4 whereby the transfer process of substrate S3 is performed in the learning mode (the relative positions of the processing steps are thus in correspondence with FIG. 3), while, for the processing of substrate S4, the transfer process (3) is initiated earlier (relative to the chuck exchange CEX), as indicated by the arrow 400. because the initiation of the transfer process is based on the actual processing time, the loading process is synchronized with the processing of the lithographic apparatus such that a new substrate (such as substrate S4) can be loaded immediately following the chuck exchange (CEX). As a result, substrates can be transferred by the substrate handler at a continuous pace whereby the processing time inside the handler, in particular the processing by the load or unload robots can be kept constant. As a further result, the exchange process WEX can be shortened and the idle time $\Delta t$ can substantially be reduced to zero.

In an embodiment of the present invention, the predetermined processing characteristic that is used to determine the instance at which to start the transfer process, is based on a model describing a processing time of the substrate by the lithographic apparatus. In such embodiment, the processing time of a substrate inside the lithographic apparatus (as e.g., discussed above) is modeled. Such model can e.g., include a variety of parameters including optical parameters or mechanical parameters, parameters related to the applied resist on the substrate, lot-specific parameters, etc. . . .

For further information on the prediction or scheduling of tasks in a lithographic process, reference can e.g., be made to U.S. 2005/0278049, which is incorporated herein by reference in its entirety.

Such model may further include, for a given process to be performed, a model to calculate a set-up time of the lithographic apparatus, in order to e.g., take into account any adjustments or settings needed prior to the exposure.

Note that, in an embodiment, a combination of modeling and measurements can be performed in order to arrive at the processing characteristic of the lithographic apparatus and thus arrive at the instance when to start the transfer process.

In an embodiment, the processing characteristic (e.g., the processing time of a substrate) is determined at regular intervals (e.g., for each substrate or every fifth or tenth substrate) and the instance at which to start the transfer process is adjusted using these processing characteristics. As an example, when processing times are available for a comparatively large number of substrates, the instance can be determined using a moving average filtering of the data.

Such moving average filtering can e.g., include determining the average processing time of the latest 10 substrates of which the processing time is determined as the processing time on which the instance is based.

By doing so, comparatively slow effects on the performance of the lithographic apparatus and thus the processing characteristic can be taken into account. As an example, a transmission degradation of an optical component of the lithographic apparatus may affect the processing time.

In an embodiment, the thermal conditioning of substrates that are handled in a substrate handler are improved by including a thermal conditioning unit in the substrate handler for heating and or cooling of substrates. In an embodiment, such a thermal conditioning unit is arranged at a waiting position such as the waiting positions W1 and W2 as shown in FIG. 2. As an example, the waiting position W1 can be provided with a cooling unit for cooling a substrate that is received from a track and may thus be at a comparatively high temperature, the waiting position W2 can be provided with a heating unit for uniformly heating a substrate prior to being transported by the load robot LR to the lithographic apparatus.

In an embodiment, the present invention provides in a lithographic system comprising: a lithographic apparatus arranged to transfer a pattern from a patterning device onto a substrate, the apparatus comprising a port for connecting the lithographic apparatus to a substrate handler for receiving substrates to be exposes; wherein the system further comprises: a substrate handler according as described above.

In order to control the operation of the substrate handler according to the present invention, in particular the timing of the transfer process as described, a control unit can be provided (either as part of a control unit of the lithographic apparatus or as a separate control unit) for: monitoring the processing characteristic of the lithographic apparatus; determining the instance; and controlling the substrate handler to start the transfer process at the instance.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A substrate handler for transferring substrates to be exposed to a lithographic apparatus, the substrate handler configured to transfer the substrates at a first speed during processing of the substrates, the substrate handler comprising:

a controller configured to determine an instance for starting a transfer process of a first one of the substrates, wherein the instance is determined during a time when the substrate handler transfers the substrates at a second speed slower than the first speed, and wherein the instance is based on a predetermined processing characteristic of the lithographic apparatus.

2. The substrate handler according to claim 1, wherein the predetermined processing characteristic includes a calculated or measured processing time of a substrate.

3. The substrate handler according to claim 1, wherein the instance is selected to maintain a transfer period in the substrate handler of different substrates substantially constant.

4. The substrate handler according to claim 1, further comprising a first load/unload port for connecting to a track and a second load/unload port for connecting to the lithographic apparatus.

5. The substrate handler according to claim 1, further comprising a load robot for transferring the substrate inside the substrate handler, wherein a transfer period includes a handling period of the substrate by the load robot.

6. The substrate handler according to claim 1, wherein the predetermined processing characteristic is obtained by measurements of a processing time of a substrate by the lithographic apparatus.

7. The substrate handler according to claim 1, wherein the predetermined processing characteristic is based on a model describing a processing time of a substrate by the lithographic apparatus.

8. The substrate handler according to claim 1, wherein the predetermined processing characteristic comprises a measured processing time of at least one earlier processed substrate.

9. The substrate handler according to claim 1, wherein the predetermined processing characteristic comprises processing times of a plurality of substrates, the instance being based on a moving average filtering of the processing times.

10. The substrate handler according to claim 1, further comprising a thermal conditioning unit for conditioning the substrates.

11. The substrate handler according to claim 10, wherein the thermal conditioning unit comprises a cooling unit for cooling substrates received from the track and a heating unit for heating substrates received from the cooling unit.

12. A lithographic system comprising:

a lithographic apparatus arranged to transfer a pattern from a patterning device onto one or more substrates, the lithographic apparatus comprising a port; and a substrate handler, configured to transfer the one or more substrates at a first speed during processing of the one or more substrates, and comprising a controller configured to determine an instance for starting a transfer process of a first one of the substrates, wherein the instance is determined during a time when the substrate handler transfers the one or more substrates at a second speed slower than the first speed, and wherein the instance is based on a predetermined processing characteristic of the lithographic apparatus, wherein the substrate handler is connectable to the port for connecting the lithographic apparatus to the substrate handler for receiving the substrates to be exposed.

13. The lithographic system according to claim 2, further comprising a control unit configured to:

monitor the processing characteristic of the lithographic apparatus;

determine the instance;

control the substrate handler to start the transfer process at the instance.

14. A device manufacturing method comprising:

transferring one or more substrates to a lithographic apparatus by a substrate handler;

slowing a speed at which the substrate handler transfers the one or more substrates;

determining an instance for starting a transfer process of a first one of the substrates, wherein the instance is based, at least in part, on a predetermined processing characteristic of the lithographic apparatus in order to maintain a transfer period of different substrates in the substrate handler substantially constant, and wherein the determining is performed during the slowed speed at which the substrate handler transfers the one or more substrates; and starting a transfer process of the substrate handler at the determined instance.

* * * * *